United States Patent
Hu et al.

(10) Patent No.: US 9,117,678 B2
(45) Date of Patent: Aug. 25, 2015

(54) SEMICONDUCTOR DEVICES

(71) Applicant: TAIWAN SEMICONDUCTOR MANUFACTURING COMPANY LTD., Hsinchu (TW)

(72) Inventors: Chang-Fen Hu, Hsinchu (TW); Wun-Jie Lin, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/106,518

(22) Filed: Dec. 13, 2013

(65) Prior Publication Data

US 2015/0171073 A1    Jun. 18, 2015

(51) Int. Cl.
*H01L 29/92* (2006.01)
*H01L 27/02* (2006.01)

(52) U.S. Cl.
CPC .................. *H01L 27/0288* (2013.01)

(58) Field of Classification Search
USPC .................................. 257/363, 365
See application file for complete search history.

(56) References Cited

U.S. PATENT DOCUMENTS 5,637,892 A * 6/1997 Leach ............................ 257/362
2009/0026544 A1 * 1/2009 Uno et al. ..................... 257/365

* cited by examiner

*Primary Examiner* — Marc Armand
(74) *Attorney, Agent, or Firm* — WPAT, P.C.; Anthony King

(57) ABSTRACT

A semiconductor device includes a semiconductor region, a first active region in the semiconductor region, a second active region in the semiconductor region, and a conductive gate disposed above the first active region and the second active region. A first contact of the conductive gate is configured to couple to a first node of a circuit associated with the semiconductor device. Moreover, a second contact of the conductive gate is configured to couple to a second node of a circuit associated with the semiconductor device. A resistive device is defined between the first contact and the second contact.

19 Claims, 8 Drawing Sheets

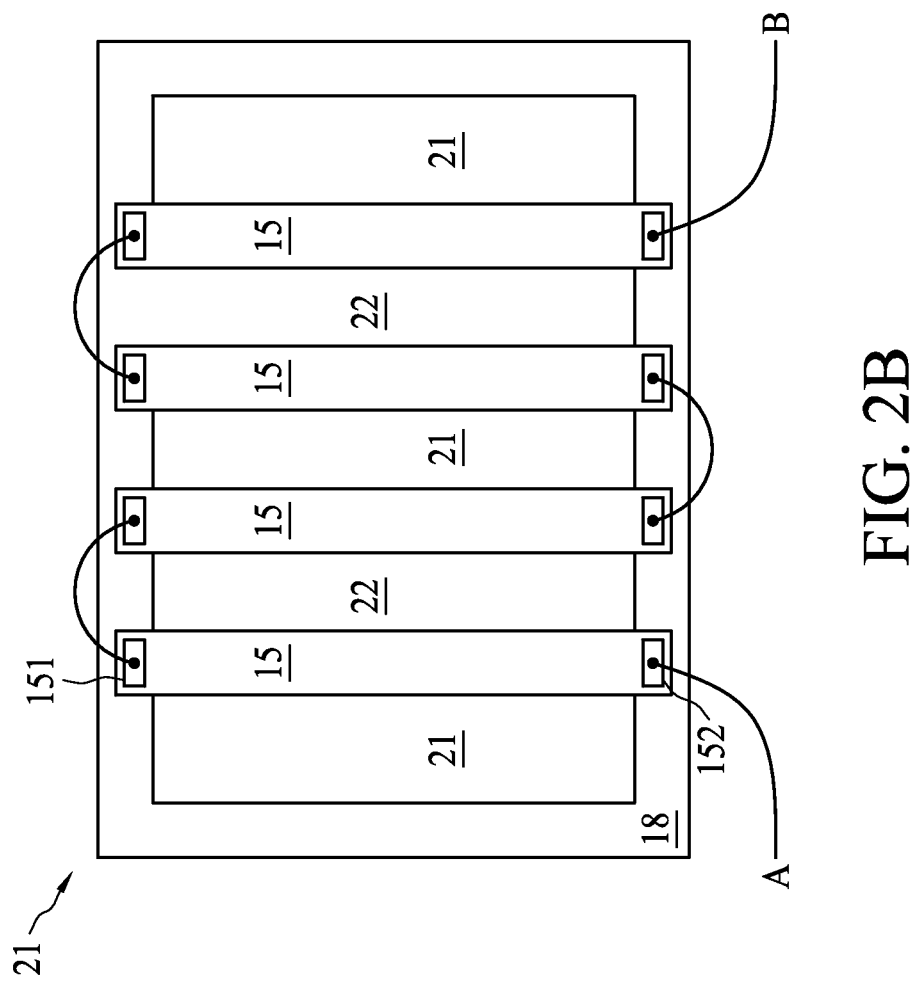

SEMICONDUCTOR DEVICES

BACKGROUND

Resistors are fundamental elements in circuit design and play an important role to achieve desired functions in a circuit. For example, resistors are implemented within integrated circuits, and can be integrated into hybrid circuits. Moreover, resistors are used in electrostatic discharge (ESD) protection circuits, and work in conjunction with diodes or capacitors to provide ESD protection for internal circuits.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

FIG. 2B is a schematic diagram of a semiconductor device in accordance with still another embodiment.

Like reference symbols in the various drawings indicate like elements.

DETAILED DESCRIPTION

Figure 2A:
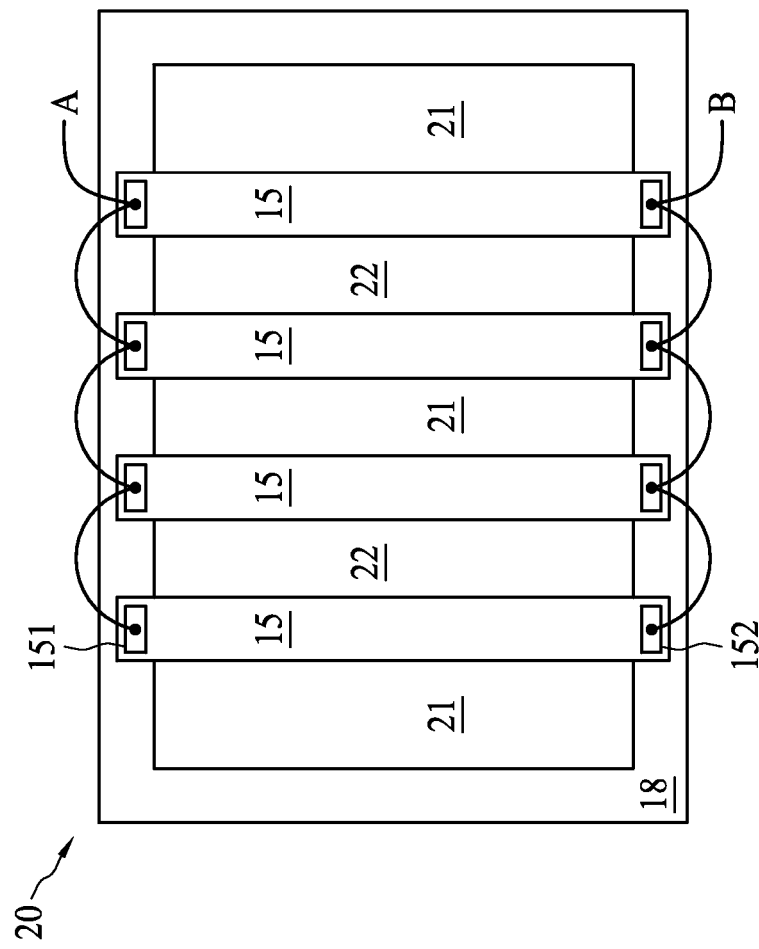
FIG. 2A is a schematic diagram of a semiconductor device in accordance with another embodiment.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled with" another element, it may be directly connected to or coupled to the other element, or intervening elements may be present.

Figure 1:
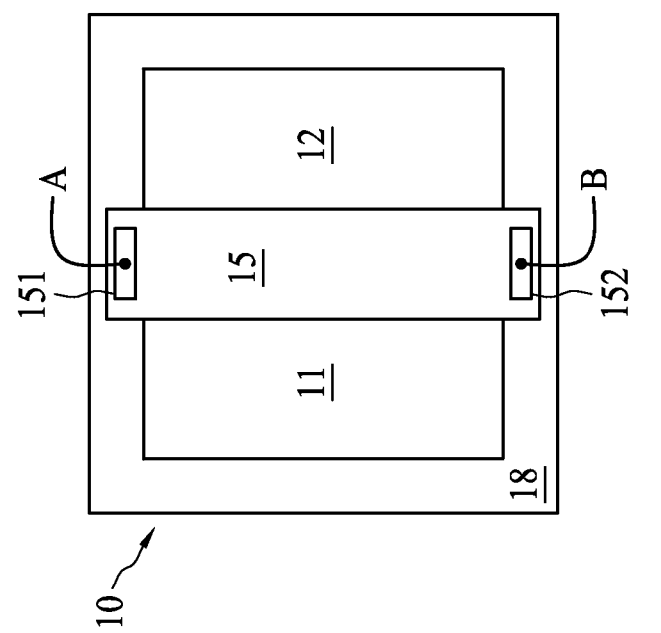
FIG. 1 is a schematic diagram of a semiconductor device in accordance with an embodiment.

FIG. 1 is a schematic diagram of a semiconductor device 10 in accordance with various embodiments. Referring to FIG. 1, semiconductor device 10 includes a first active region 11, a second active region 12, and a conductive gate 15. First active region 11 and second active region 12 are separated from each other and are formed within a semiconductor region 18. In some embodiments, first active region 11 and second active region 12 include diffused regions, which may be formed with a p-type or an n-type impurity. Moreover, semiconductor region 18 includes one of a p-type well region (hereinafter a "p-well"), an n-type well region (hereinafter an "n-well"), and a substrate lightly doped with a p-type impurity.

Conductive gate 15 is disposed above first active region 11 and second active region 12. Suitable materials for conductive gate 15 include but are not limited to poly silicon, highly doped silicon, aluminum, tungsten, silicide such as titanium silicide (TiSi), tantalum silicide (TaSi), tungsten silicide (WSi) and molybdenum silicide (MoSi), or a stack structure thereof. Conductive gate 15 includes a first contact 151 and a second contact 152. First contact 151 is configured to electrically couple to a node A, and second contact 152 is configured to electrically couple to a node B. While serving as a conductive electrode, conductive gate 15 exhibits a resistive behavior during signal transmission. As a result, in semiconductor device 10 a resistive device, such as a resistor, extending between first contact 151 and second contact 152 is defined between nodes A and B.

In some embodiments, first active region 11 includes a first impurity type such as the p-type, while second active region 12 includes a second impurity type, such as the n-type, different from the first impurity type. Accordingly, a diode is defined between first active region 11 and second active region 12. In that case, semiconductor device 10 includes a resistor-on-diode structure, wherein the resistor is defined between first contact 151 and second contact 152, and the diode is defined between first active region 11 and second active region 12.

In other embodiments, first active region 11 and second active region 12 include a same impurity type. For example, first active region 11 and second active region 12 are both n-type, while semiconductor region 18 is a p-well. In that case, first active region 11 and second active region 12 serve as a drain and a source, or vice versa, for an n-type transistor such as an n-type metal-oxide-semiconductor (NMOS) transistor. Semiconductor device 10 thus includes a resistor-on-transistor or resistor-on-MOS structure, wherein the resistor is defined between first contact 151 and second contact 152, and the transistor is defined by first active region 11, second active region 12 and conductive gate 15.

For another example, first active region 11 and second active region 12 are both p-type, while semiconductor region 18 is an n-well. In that case, first active region 11 and second active region 12 serve as a drain and a source, or vice versa, for a p-type transistor such as a p-type metal-oxide-semiconductor (PMOS) transistor. Semiconductor device 10 thus includes a resistor-on-transistor or resistor-on-MOS structure, wherein the resistor is defined between first contact 151 and second contact 152, and the transistor is defined by first active region 11, second active region 12 and conductive gate 15.

FIG. 2A is a schematic diagram of a semiconductor device 20 in accordance with another embodiment. Referring to FIG. 2A, semiconductor device 20 is similar to semiconductor device 10 described and illustrated with reference to FIG. 1 except that, for example, semiconductor device 20 has a multi-gate structure, while semiconductor device 10 has a single-gate structure.

Semiconductor device 20 includes more than one conductive gates 15 extending substantially in parallel with each other. For illustration, four conductive gates 15 are shown. Each of conductive gates 15 is disposed above two corresponding active regions 21 and 22. Furthermore, semiconductor device 20 includes a plurality of active regions 21 and 22 interleaved with each other. The plurality of active regions 21 and 22 together define an active area where active devices such as diodes, varactors and transistors may be formed. Moreover, first contacts 151 of conductive gates 15 are connected together to node A, and second contacts 152 of conductive gates 15 are connected together to node B. Accordingly, four resistors each defined between first contact 151 and second contact 152 of a corresponding conductive gate 15 are coupled in parallel.

Active regions 21 and 22 are similar to first active region 11 and second active region 12 described and illustrated with reference to FIG. 1. In some embodiments, active regions 21 have a different impurity type from active regions 22. For example, active regions 21 and 22 are p-type and n-type regions, respectively. Accordingly, four diodes each defined by active region 21 and an immediately adjacent active region 22 are formed in semiconductor device 20. In that case, semiconductor device 20 includes a resistor-on-diode structure, wherein four resistors are connected in parallel between nodes A and B, and four diodes are formed by immediately adjacent active regions 21 and 22.

FIG. 2B is a schematic diagram of a semiconductor device 21 in accordance with still another embodiment. Referring to FIG. 2B, semiconductor device 21 is similar to semiconductor device 20 described and illustrated with reference to FIG. 2A except that, for example, resistors in semiconductor device 21 are connected in series. Specifically, except those conductive gates coupled to nodes A and B, first contact 151 of an intermediate conductive gate in between is coupled to first contact 151 of one of a previous one and a next one conductive gate, and second contact 152 of the intermediate conductive gate is coupled to second contact 152 of the other one of the previous one and the next one conductive gate.

Figure 3A:
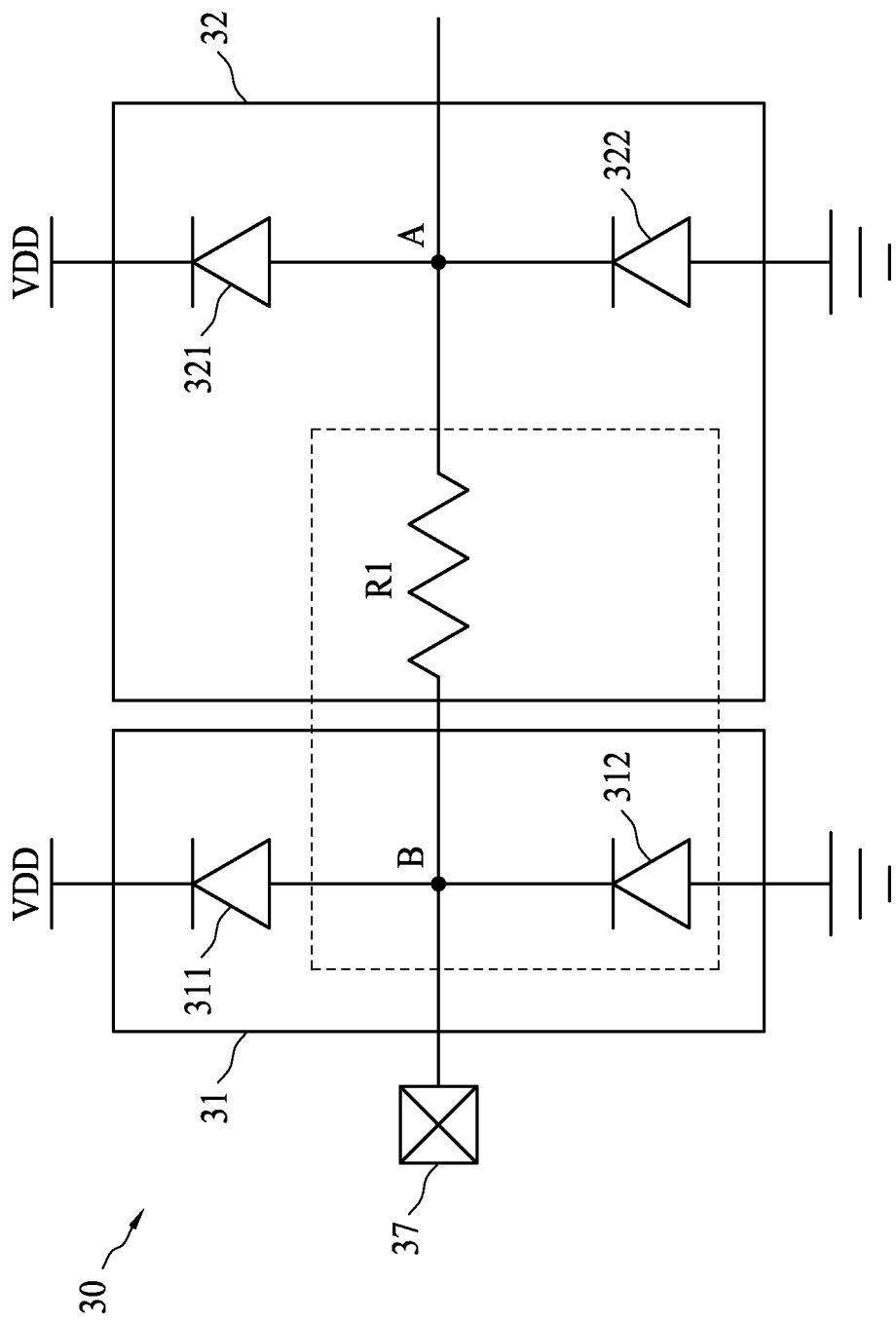
FIG. 3A is a diagram of a circuit for electrostatic discharge (ESD) protection, to which semiconductor devices illustrated in FIGS. 1, 2A and 2B can be applied, in accordance with some embodiments.

FIG. 3A is a diagram of a circuit 30 for electrostatic discharge (ESD) protection, to which semiconductor devices illustrated in FIGS. 1, 2A and 2B can be applied, in accordance with some embodiments. Referring to FIG. 3A, circuit 30 includes a primary ESD protection circuitry 31 and a secondary ESD protection circuitry 32. Primary ESD protection circuitry 31 includes a first diode 311 and a second diode 312. Secondary ESD protection circuitry 32 includes a first diode 321, a second diode 322 and a resistor R1. Resistor R1 extends between nodes A and B.

In primary ESD protection circuitry 31, an anode of first diode 311 is coupled to node B and then to an input/output (I/O) pad 37. A cathode of first diode 311 receives a power supply VDD. Moreover, a cathode of second diode 312 is coupled to node B and then to I/O pad 37. An anode of second diode 312 receives a reference voltage, for example, ground.

In secondary ESD protection circuitry 32, an anode of first diode 321 is coupled to node A and then to an internal circuit (not shown). A cathode of first diode 321 receives a power supply VDD. Moreover, a cathode of second diode 322 is coupled to node A. An anode of second diode 322 receives the reference voltage.

ESD protection circuit 30 can be implemented using at least one of semiconductor devices 10, 20 and 21 illustrated in FIGS. 1, 2A and 2B, respectively. For example, resistor R1 and second diode 312 of ESD protection circuit 30, as shown in a dashed block, may be implemented using semiconductor device 20, as will be discussed by reference to FIG. 3B below.

Figure 3B:
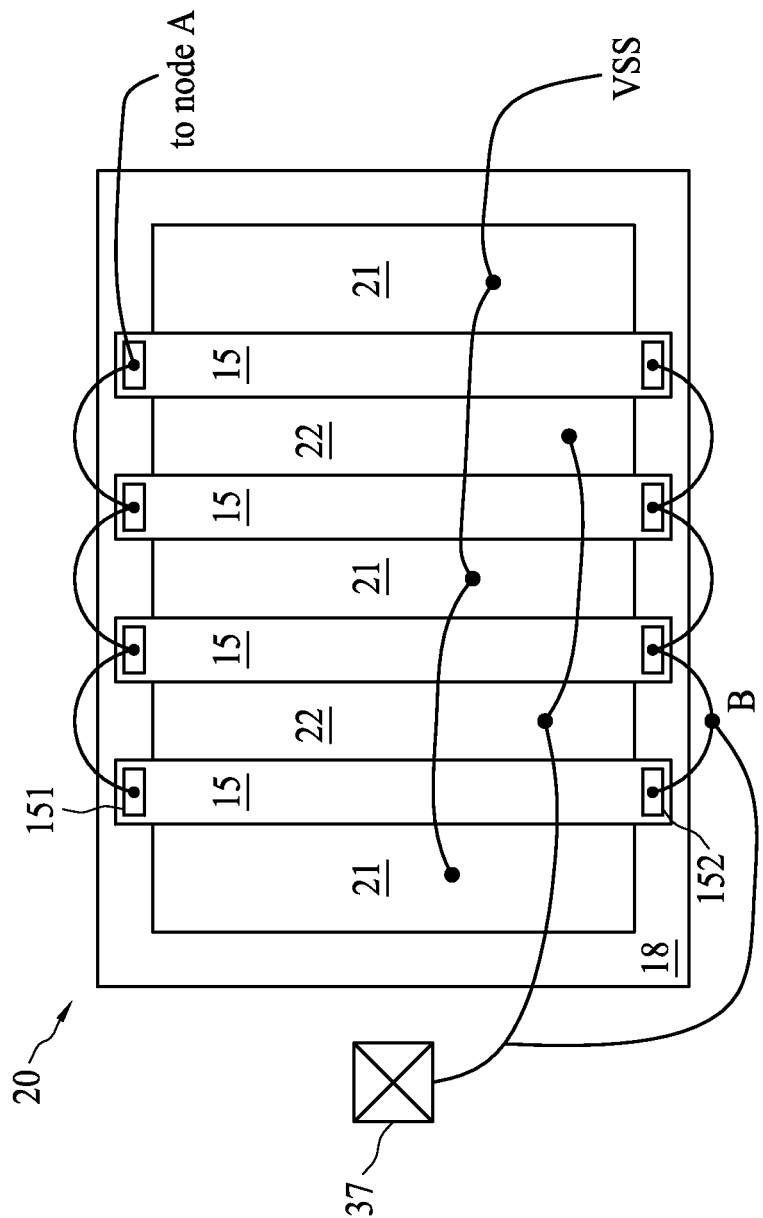
FIG. 3B is a diagram illustrating an exemplary application of the semiconductor device illustrated in FIG. 2A to the circuit illustrated in FIG. 3A.

FIG. 3B is a diagram illustrating an exemplary application of the semiconductor device 20 illustrated in FIG. 2A to circuit 30 illustrated in FIG. 3A. Referring to FIG. 3B, active regions 21 and 22 of semiconductor device 20 are configured as p-type and n-type regions, respectively. By connecting first contacts 151 of conductive gates 15 to node A, second contacts 152 of conductive gates 15 to I/O pad 37, active regions 21 to reference voltage VSS, and active regions 22 to I/O pad 37, semiconductor device 20 serves as resistor R1 and second diode 312. In some embodiments, however, semiconductor device 10 or 20 is used to implement resistor R1 and second diode 312. Furthermore, in other embodiments, at least one of semiconductor devices 10, 20 and 21 is used to implement resistor R1 in combination with at least one of diodes 311, 312, 321 and 322. Effectively, ESD protection circuit 30 can be implemented using at least one of semiconductor devices 10, 20 and 21.

Figure 4:
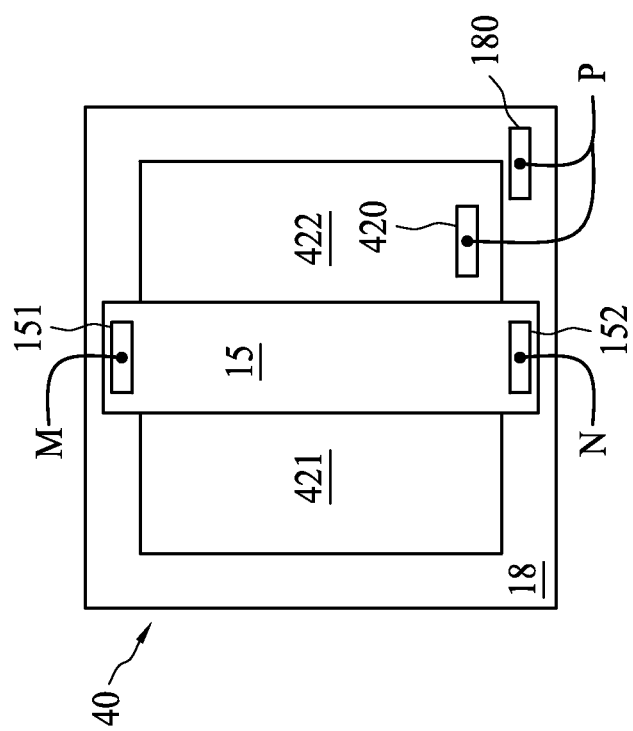
FIG. 4 is a schematic diagram of a semiconductor device in accordance with yet another embodiment.

FIG. 4 is a schematic diagram of a semiconductor device 40 in accordance with yet another embodiment. Referring to FIG. 4, semiconductor device 40 includes a first active region 421, a second active region 422, and conductive gate 15. First active region 421 and second active region 422 are formed within semiconductor region 18. Furthermore, first active region 421, second active region 422 and semiconductor region 18 include a same impurity type, for example, n-type. In semiconductor device 40, a resistive device, such as a resistor, extending between first contact 151 and second contact 152 of conductive gate 15 is defined between nodes M and N. Moreover, a capacitive device, such as a varactor, is defined by conductive gate 15, one of first active region 421 and second active region 422, and semiconductor region 18. A contact 420 is configured to electrically couple second active region 422 to a node P, one end of the varactor. A contact 180 is configured to electrically couple semiconductor region 18 to node P. In some embodiments, as shown in FIG. 4, a varactor is defined by conductive gate 15, second active region 422 and semiconductor region 18. Accordingly, semiconductor device 40 includes a resistor-on-varactor structure.

Figure 5B:
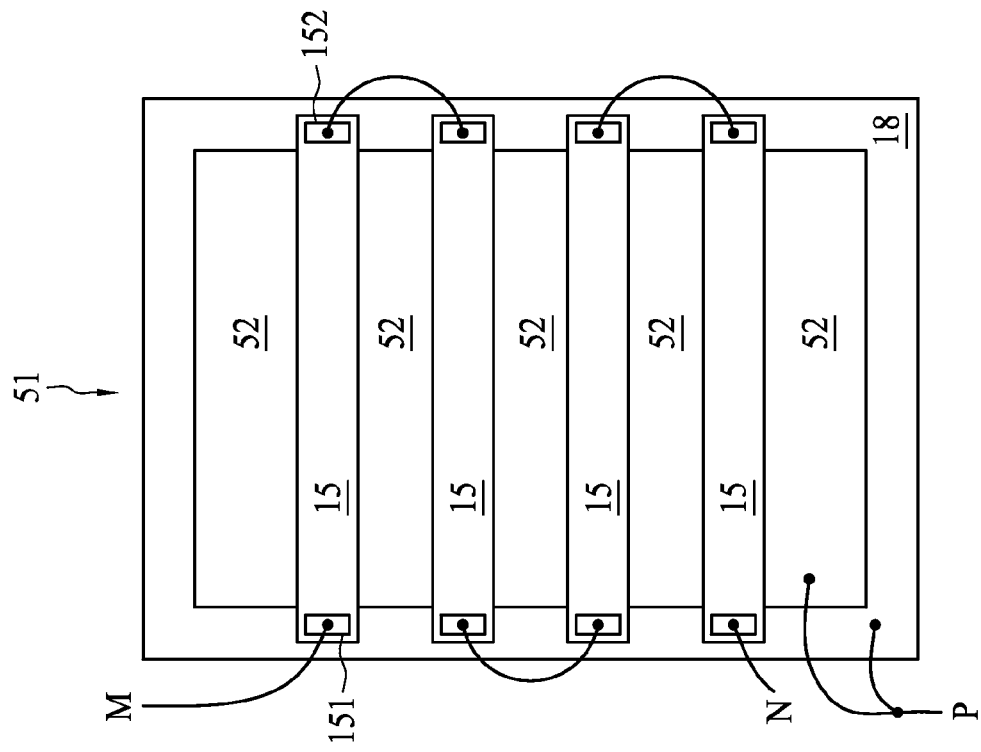
FIG. 5B is a schematic diagram of a semiconductor device in accordance with a further embodiment.
Figure 5A:
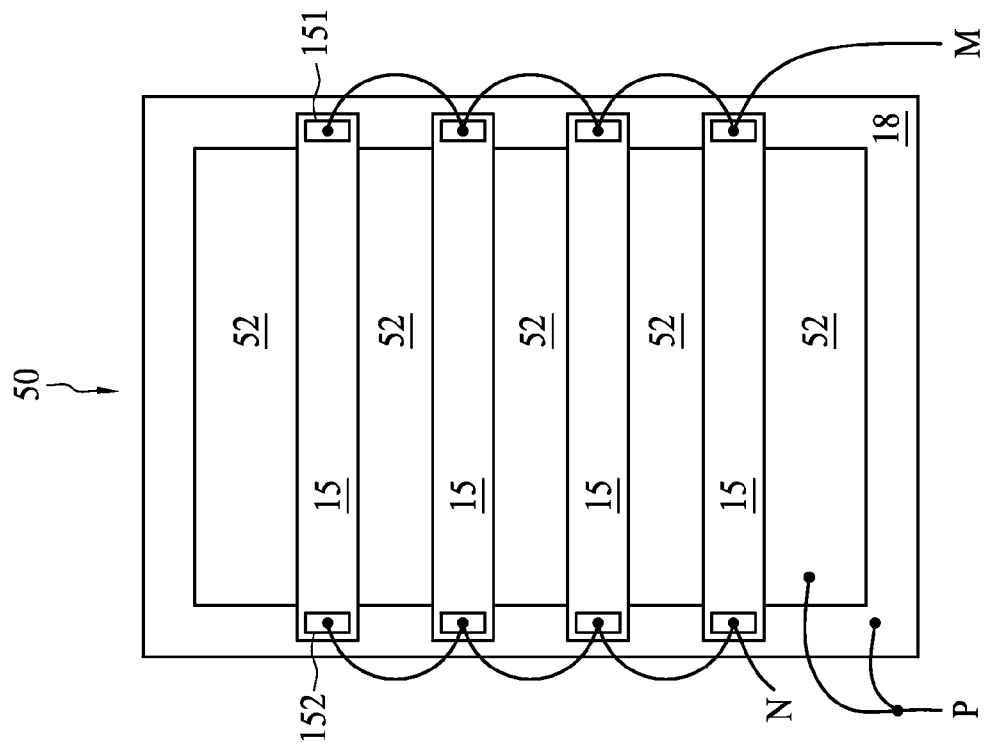
FIG. 5A is a schematic diagram of a semiconductor device in accordance with yet still another embodiment.

FIG. 5A is a schematic diagram of a semiconductor device 50 in accordance with yet still another embodiment. Referring to FIG. 5A, semiconductor device 50 is similar to semiconductor device 40 described and illustrated with reference to FIG. 4 except that, for example, semiconductor device 50 has a multi-gate structure, while semiconductor device 40 has a single-gate structure.

Semiconductor device 50 includes more than one conductive gates 15 extending substantially in parallel with each other. Furthermore, active regions 52 and semiconductor region 18 are of a same impurity type. For illustration, four conductive gates 15 are shown. Each of conductive gates 15 is disposed above two corresponding active regions 52. Moreover, first contacts 151 of conductive gates 15 are connected together to node M, and second contacts 152 of conductive gates 15 are connected together to node N. Accordingly, four resistors each defined between first contact 151 and second contact 152 of a corresponding conductive gate 15 are coupled in parallel.

FIG. 5B is a schematic diagram of a semiconductor device 51 in accordance with a further embodiment. Referring to FIG. 5B, semiconductor device 51 is similar to semiconductor device 50 described and illustrated with reference to FIG. 5A except that, for example, resistors in semiconductor device 51 are connected in series. Specifically, except those conductive gates coupled to nodes M and N, first contact 151 of an intermediate conductive gate in between is coupled to first contact 151 of one of a previous one and a next one conductive gate, and second contact 152 of the intermediate conductive gate is coupled to second contact 152 of the other one of the previous one and the next one conductive gate.

Figure 6B:
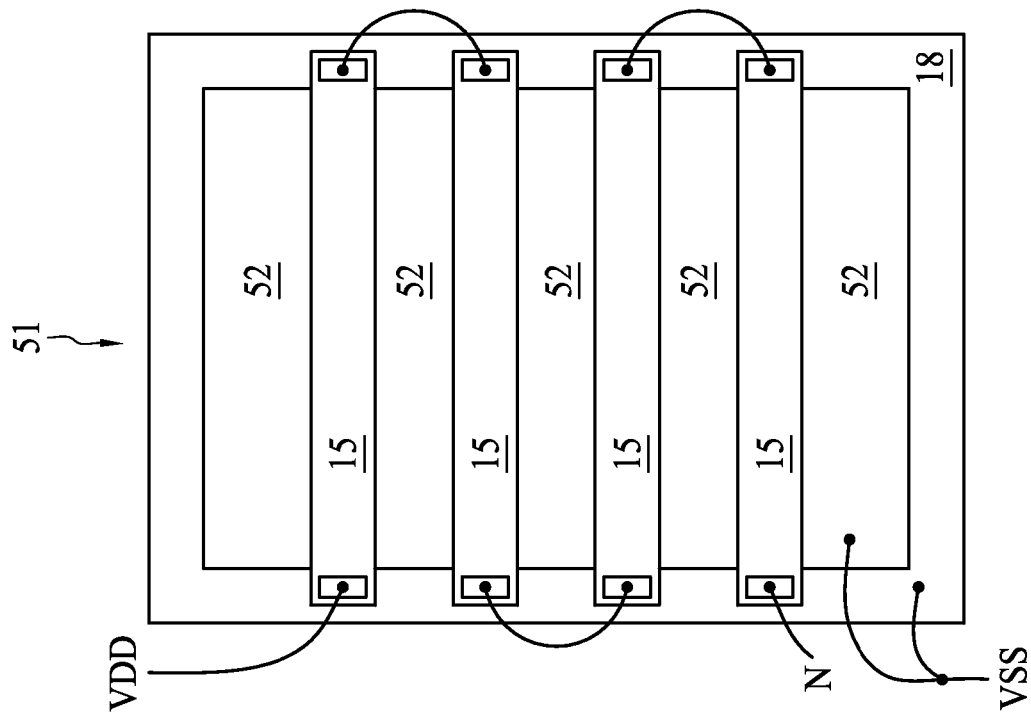
FIG. 6B is a diagram illustrating an exemplary application of the semiconductor device illustrated in FIG. 5B to the circuit illustrated in FIG. 6A.
Figure 6A:
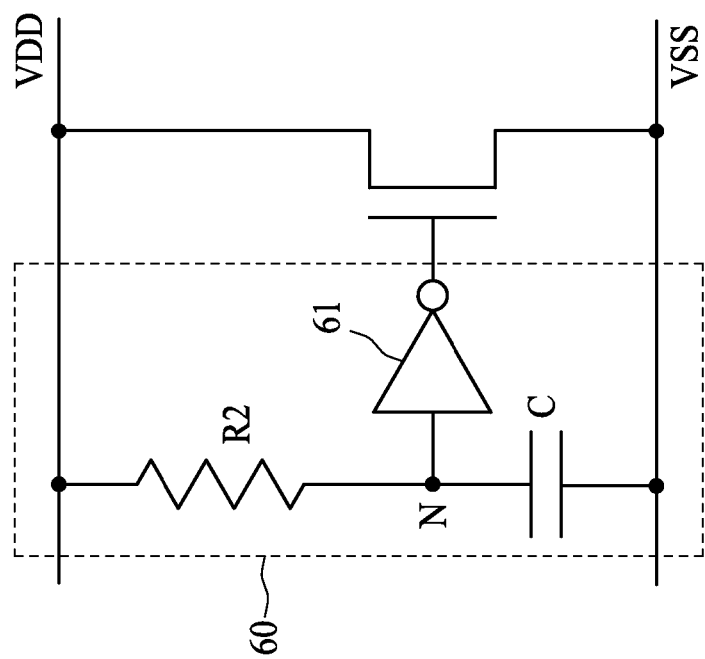
FIG. 6A is a diagram of a circuit for electrostatic discharge (ESD) detection, to which semiconductor devices illustrated in FIGS. 4, 5A and 5B can be applied, in accordance with some embodiments.

FIG. 6A is a diagram of a circuit 60 for electrostatic discharge (ESD) detection, to which semiconductor devices illustrated in FIGS. 4, 5A and 5B can be applied, in accordance with some embodiments. Referring to FIG. 6A, circuit 60 includes a resistive device such as a resistor R2, a capacitive device such as a capacitor C and an inverting device such as an inverter 61. An input of inverter 61 is coupled to node N, an terminal of resistor R2 and an terminal of capacitor C. An output of inverter 61 is coupled to a gate of a transistor (not numbered). Moreover, resistor R2 is coupled between input of inverter 61 and power supply VDD, while capacitor C is coupled between input of inverter 61 and reference voltage VSS.

FIG. 6B is a diagram illustrating an exemplary application of semiconductor device 51 illustrated in FIG. 5B to circuit 60 illustrated in FIG. 6A. As previously discussed, in semiconductor device 51 a serially connected resistor is defined between nodes M and N. Referring to FIG. 6B, by connecting nodes M and N to power supply VDD and inverter 61, respectively, semiconductor device 51 is used to implement resistor R2 and capacitor C in circuit 60.

Figure 7:
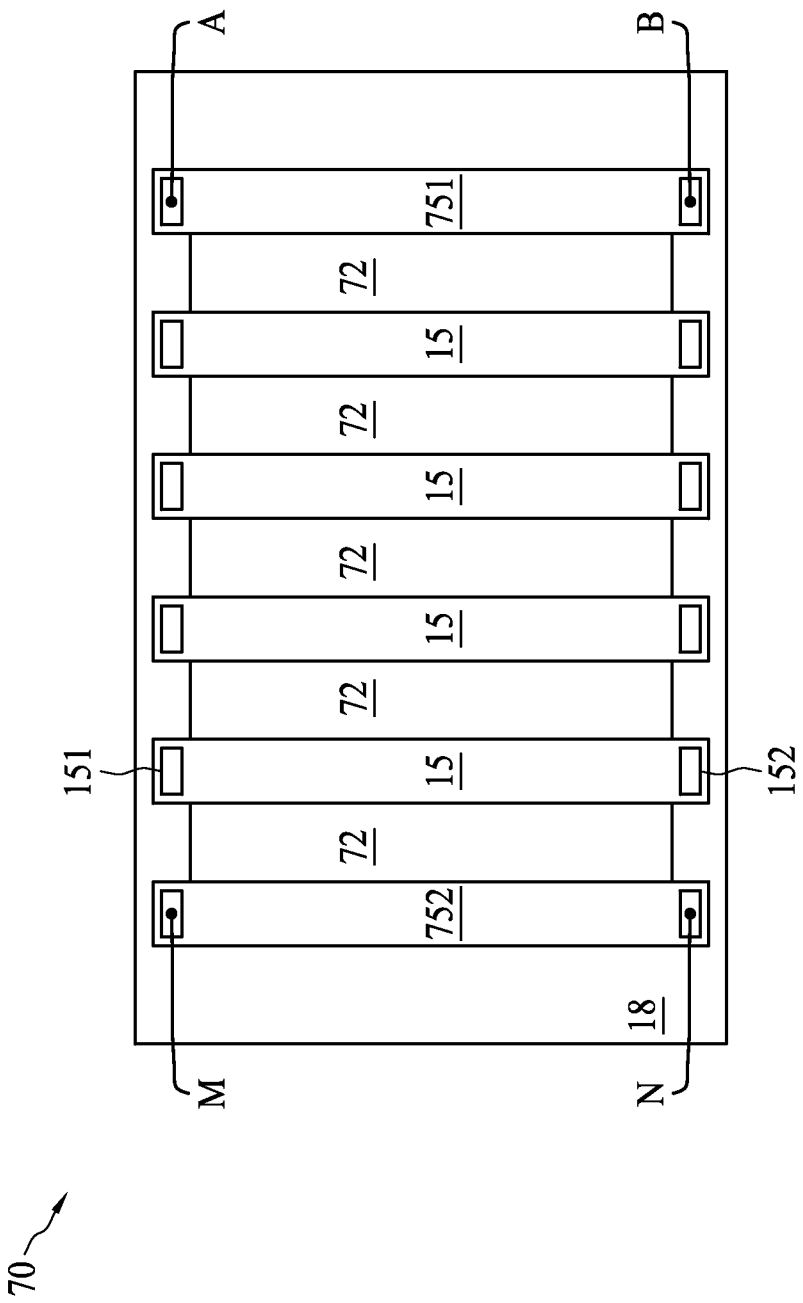
FIG. 7 is a schematic diagram of a semiconductor device in accordance with a still further embodiment.

FIG. 7 is a schematic diagram of a semiconductor device 70 in accordance with a still further embodiment. Referring to FIG. 7, semiconductor device 70 includes active regions 72, conductive gates 15, a first conductive gate 751 and a second conductive gate 752. Active regions 72 together define an active area, where active devices may be formed or defined in conjunction with active regions. Each of active regions 72 includes a desired impurity type, depending on a corresponding active device formed therewith. Moreover, the active area defined by active regions 72 is formed in semiconductor region 18, which is a non-active area. Conductive gates 15 are disposed above active regions 72 and hence the active area.

First conductive gate 751, which is similar to conductive gates 15 in material, is disposed on an edge of the active area. Consequently, first conductive gate 751 is disposed above a boundary between the active area and semiconductor region 18, a non-active area. First conductive gate 751 includes a first contact (not numbered) coupled to node A and a second contact (not numbered) coupled to node B. Effectively, a resistor in first conductive gate 751 is defined between nodes A and B.

Similarly, second conductive gate 752 is similar to conductive gates 15 in material, and is disposed on an edge of the active area. Consequently, second conductive gate 752 is disposed above a boundary between the active area and a non-active area. Second conductive gate 752 includes a first contact (not numbered) coupled to node M and a second contact (not numbered) coupled to node N. Effectively, a resistor in second conductive gate 752 is defined between nodes M and N.

Some embodiments of the present disclosure provide a semiconductor device (10, 40). Semiconductor (10, 40) includes a semiconductor region (18), a first active region (11, 21) in the semiconductor region, a second active region (12, 22) in the semiconductor region, and a conductive gate (15) disposed above the first active region and the second active region. A first contact (151) of the conductive gate is configured to couple to a first node (A) of a circuit associated with the semiconductor device. A second contact (152) of the conductive gate is configured to couple to a second node (B) of a circuit associated with the semiconductor device. A resistive device is defined between the first contact and the second contact.

Embodiments of the present disclosure also provide a semiconductor device (20, 21, 50, 51). Semiconductor device (20, 21, 50, 51) includes a semiconductor region, a plurality of first active regions (21, 52) in the semiconductor region, a plurality of second active regions (22, 52) in the semiconductor region, and a plurality of conductive gates. The plurality of first active regions and the plurality of second active regions are interleaved with each other and together define an active area in the semiconductor region. The plurality of conductive gates are disposed above the active area. Each of the plurality of conductive gates includes a first contact and a second contact. A resistive device is defined between the first contact and the second contact of each of the plurality of conductive gates.

In some embodiments, resistors associated with the plurality of conductive gates are connected in parallel.

Moreover, the plurality of first contacts are configured to couple to a node of a circuit associated with the semiconductor device, and the plurality of second contacts are configured to couple to a conductive pad. Effectively, semiconductor device (20) functions to serve as elements in an ESD protection circuit.

In other embodiments, resistors associated with the plurality of conductive gates are connected in series. The plurality of first contacts are configured to couple to a power supply, and the plurality of second contacts are configured to couple to a reference voltage. Effectively, semiconductor device (51) functions to serve as elements in an ESD detection circuit.

Some embodiments of the present disclosure further provide a semiconductor device (70). Semiconductor device (70) includes a semiconductor region, an active area in the semiconductor region, a plurality of first conductive gates disposed above the active area, and a second conductive gate (751, 752) disposed on an edge of the active area. A first contact (151) of the second conductive gate is configured to couple to a first node (A, M) of a circuit associated with the semiconductor device. The first contact serves as one end of a resistive device. A second contact (152) of the second conductive gate is configured to couple to a second node (B, N) of a circuit associated with the semiconductor device. The second contact serves as the other end of the resistive device. The resistive device is defined between the first contact and the second contact.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:
1. A semiconductor device, comprising:
a semiconductor region;
a first active region in the semiconductor region;
a second active region in the semiconductor region;
a conductive gate disposed above the first active region and the second active region;
a first contact of the conductive gate configured to couple to a first node of a circuit associated with the semiconductor device; and a second contact of the conductive gate configured to couple to a second node of a circuit associated with the semiconductor device;

wherein a resistive device defined between the first contact and the second contact causes the first node to be different from the second node.

2. The semiconductor device of claim 1, wherein the first active region and the second active region include different impurity types.

3. The semiconductor device of claim 1, wherein the first active region and the second active region include a first impurity type.

4. The semiconductor device of claim 3, wherein the semiconductor region includes a well region of a second impurity type different from the first impurity type.

5. The semiconductor device of claim 3, wherein the semiconductor region includes a well region of the first impurity type, further comprising a third contact of one of the first active region and the second active region and a fourth contact of the semiconductor region, wherein the third contact and the fourth contact are configured to couple to a capacitive device.

6. A semiconductor device comprising:
a semiconductor region;
a plurality of first active regions in the semiconductor region;
a plurality of second active regions in the semiconductor region, wherein the plurality of first active regions and the plurality of second active regions are interleaved with each other and together define an active area in the semiconductor region; and
a plurality of conductive gates disposed above the active area, wherein each of the plurality of conductive gates includes a first contact and a second contact, and a resistive device is defined by a conductive path through the first contact, the conductive gate, and the second contact.

7. The semiconductor device of claim 6, wherein the plurality of first active regions and the plurality of second active regions include different impurity types.

8. The semiconductor device of claim 6, wherein the plurality of first active regions and the plurality of second active regions include a first impurity type.

9. The semiconductor device of claim 6, wherein resistive devices associated with the plurality of conductive gates are connected in parallel.

10. The semiconductor device of claim 6, wherein resistive devices associated with the plurality of conductive gates are connected in series.

11. The semiconductor device of claim 7, wherein the semiconductor region includes one of a substrate, a p-type well region and an n-type well region.

12. The semiconductor device of claim 8, wherein the semiconductor region includes a well region of a second impurity type different from the first impurity type.

13. The semiconductor device of claim 8, wherein the semiconductor region includes a well region of the first impurity type, further comprising a third contact of one of the plurality of first active regions and the plurality of second active regions and a fourth contact of the semiconductor region, wherein the third contact and the fourth contact are configured to couple to one of the first contact and the second contact.

14. The semiconductor device of claim 9, wherein the plurality of first contacts are configured to couple to a node of a circuit associated with the semiconductor device, and the plurality of second contacts are configured to couple to a conductive pad.

15. The semiconductor device of claim 10, wherein the plurality of first contacts are configured to couple to a power supply, and the plurality of second contacts are configured to couple to a reference voltage.

16. A semiconductor device, comprising:
a semiconductor region;
an active area in the semiconductor region;
a plurality of first conductive gates disposed above the active area;
a second conductive gate disposed on an edge of the active area;
a first contact of the second conductive gate configured to couple to a first node of a circuit associated with the semiconductor device, and to serve as one end of a resistive device; and
a second contact of the second conductive gate configured to couple to a second node of a circuit associated with the semiconductor device, and to serve as the other end of the resistive device;
wherein the resistive device causes the first node to be different from the second node.

17. The semiconductor device of claim 16 further comprising:
a plurality of first active regions in the active area; and
a plurality of second active regions in the active area, wherein the plurality of first active regions and the plurality of second active regions are interleaved with each other.

18. The semiconductor device of claim 17, wherein the plurality of first active regions and the plurality of second active regions include different impurity types, and the semiconductor region includes one of a substrate, a p-type well region and an n-type well region.

19. The semiconductor device of claim 17, wherein the plurality of first active regions and the plurality of second active regions include a first impurity type, and the semiconductor region includes a second impurity type different from the first impurity type.

* * * * *